US009867299B2

United States Patent
Kamo (10) Patent No.: US 9,867,299 B2
(45) Date of Patent: Jan. 9, 2018

(54) ELECTRICAL CONNECTION BOX AND WIRE HARNESS

(71) Applicant: YAZAKI CORPORATION, Tokyo (JP)

(72) Inventor: Hiroaki Kamo, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/135,450

(22) Filed: Apr. 21, 2016

(65) Prior Publication Data

US 2016/0315458 A1    Oct. 27, 2016

(30) Foreign Application Priority Data

Apr. 22, 2015    (JP) .................. 2015-087879

(51) Int. Cl.
| | |
|---|---|
| H05K 7/00 | (2006.01) |
| H05K 5/02 | (2006.01) |
| B60R 16/023 | (2006.01) |
| H02G 3/08 | (2006.01) |
| H05K 5/00 | (2006.01) |

(52) U.S. Cl.
CPC ....... *H05K 5/0221* (2013.01); *B60R 16/0238* (2013.01); *H02G 3/086* (2013.01); *H05K 5/0056* (2013.01)

(58) Field of Classification Search
CPC .... H05K 5/0221; H05K 5/0056; H02G 3/086; B60R 16/0238
USPC .................. 361/728–730, 752, 796, 819, 826
See application file for complete search history.

(56) References Cited

U.S. PATENT DOCUMENTS

| | | | |
|---|---|---|---|
| 5,624,271 A | 4/1997 | Childs et al. | |
| 5,651,683 A * | 7/1997 | Shimamura | ........ H01R 13/6315 |
| | | | 174/72 A |
| 5,674,090 A | 10/1997 | Sumida et al. | |
| 5,785,546 A | 7/1998 | Hamai et al. | |

(Continued)

FOREIGN PATENT DOCUMENTS

| | | |
|---|---|---|
| CN | 1131829 A | 9/1996 |
| CN | 1309446 A | 8/2001 |

(Continued)

OTHER PUBLICATIONS

Chinese Office Action for the related Chinese Patent Application No. 201610258506.1 dated May 27, 2017.

(Continued)

*Primary Examiner* — Hung S Bui
(74) *Attorney, Agent, or Firm* — Kenealy Vaidya LLP (57) ABSTRACT

An electrical connection box that is applied to a wire harness includes: a housing that includes a housing space portion that is formed therein and houses therein a first electronic component, and a housing recessed portion that is partitioned below the housing space portion in a vertical direction by a partition wall portion, closed on one side in a horizontal direction, provided with an opening on the other side in the horizontal direction, and houses therein a second electronic component; and a latch mechanism that is positioned within the housing recessed portion and latches the second electronic component and the housing in a state that the second electronic component is housed in the housing recessed portion.

5 Claims, 7 Drawing Sheets

(56) References Cited

U.S. PATENT DOCUMENTS

| | | | |
|---|---|---|---|
| 5,928,004 A | | 7/1999 | Sumida et al. |
| 6,126,458 A | * | 10/2000 | Gregory, II ........ H01R 13/6215 |
| | | | 439/364 |
| 7,393,225 B2 | * | 7/2008 | Komizo .................... B09B 3/00 |
| | | | 439/180 |
| 2006/0286844 A1 | | 12/2006 | Komizo et al. |

FOREIGN PATENT DOCUMENTS

| | | |
|---|---|---|
| CN | 104269788 | 1/2015 |
| JP | 8-289439 A | 11/1996 |
| JP | 9-182252 A | 7/1997 |
| JP | 2004-55236 | 2/2004 |
| JP | 2007-288908 A | 11/2007 |
| JP | 2010-288368 A | 12/2010 |
| JP | 2013-34283 A | 2/2013 |
| JP | 2013-91400 A | 5/2013 |

OTHER PUBLICATIONS

Japanese Office Action for the related Japanese Patent Application No. 2015-087879 dated Jun. 6, 2017.
Japanese Office Action for the related Japanese Patent Application No. 2015-087879 dated Aug. 1, 2017.

* cited by examiner

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2015-087879 filed in Japan on Apr. 22, 2015.

BACKGROUND OF THE INVENTION

1. Field of the Invention

The present invention relates to an electrical connection box and a wire harness.

2. Description of the Related Art

As a conventional electrical connection box that is applied to a wire harness installed in a vehicle and others, for example, Japanese Patent Application Laid-open No. 2010-288368 discloses an electrical connection box that includes a box body (housing) on which electrical components (electronic components) are mounted and a lower cover that includes a leg portion fitted to the box body and extending toward a vehicle body panel. This electrical connection box is provided, on a bottom surface of the lower cover, with a mass-body mounting portion on which a mass body is mounted.

Meanwhile, in the electric connection box described in Japanese Patent Application Laid-open No. 2010-288368, even when a heavy item of relatively large mass is provided, for example, as an electronic component, it is desirable that the electronic component can be properly fitted to the housing.

SUMMARY OF THE INVENTION

In view of the above, an object of the present invention is to provide an electrical connection box and a wire harness that enable electronic components to be fitted to the housing properly.

In order to achieve the above mentioned object, an electrical connection box according to one aspect of the present invention includes a housing that includes a housing space portion that is formed therein and houses therein a first electronic component, and a housing recessed portion that is partitioned below the housing space portion in a vertical direction by a partition wall portion, closed on one side in a horizontal direction, provided with an opening on the other side in the horizontal direction, and houses therein a second electronic component; and a latch mechanism that is positioned in the housing recessed portion and latches the second electronic component and the housing in a state that the second electronic component is housed in the housing recessed portion.

According to another aspect of the present invention, in the electrical connection box, it is possible to configure that the housing recessed portion surrounds surfaces of the second electronic component other than a surface on a side of the opening by wall surfaces forming the housing recessed portion.

According to still another aspect of the present invention, in the electrical connection box, it is possible to configure that the latch mechanism includes a guide portion including a housing-side guide portion that is formed along the horizontal direction from the side of the opening to a back side in the housing recessed portion, and an electronic-component side guide portion that is formed on the second electronic component, engages with the housing-side guide portion, and is guided along the horizontal direction, and a latch portion including a housing-side latch portion that is formed in the housing recessed portion, and an electronic-component side latch portion that is formed on the second electronic component and latched by the housing-side latch portion.

In order to achieve the above mentioned object, a wire harness according to still another aspect of the present invention includes a plurality of electrical wires; and an electrical connection box that includes a housing that includes a housing space portion that is formed therein and houses therein a first electronic component to which one of the electrical wires is connected, and a housing recessed portion that is partitioned below the housing space portion in a vertical direction by a partition wall portion, closed on one side in a horizontal direction, provided with an opening on the other side in the horizontal direction, and houses therein a second electronic component to which one of the other electrical wires is connected, and a latch mechanism that is positioned in the housing recessed portion and latches the second electronic component and the housing in a state that the second electronic component is housed in the housing recessed portion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes in detail an exemplary embodiment according to the present invention based on the accompanying drawings. The invention, however, is not intended to be limited by the embodiment. The constituent elements in the following embodiment include ones that are possible and easy to substitute by a person skilled in the art, or ones that are substantially the same.

Embodiment

Figure 1:
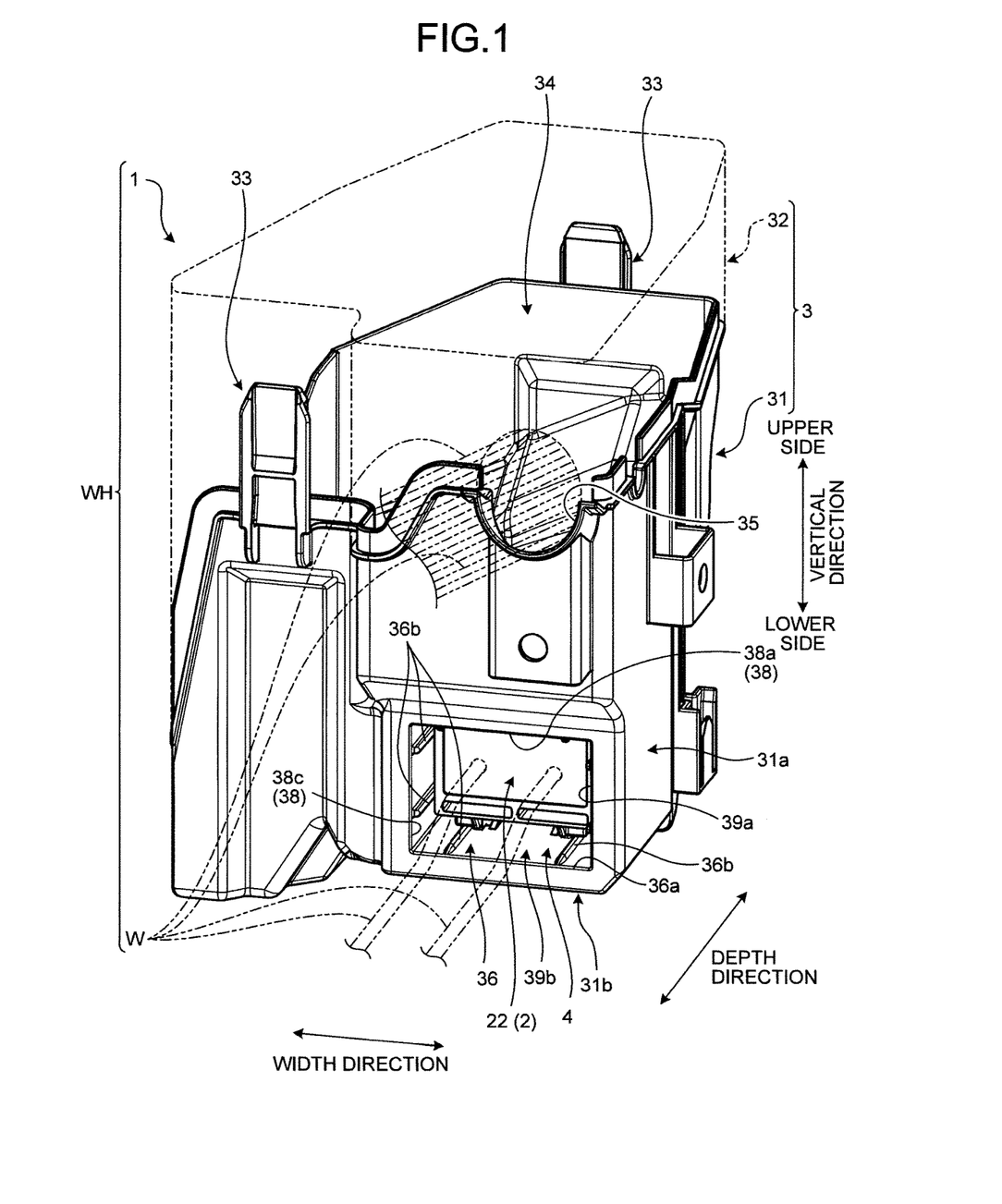
FIG. 1 is a perspective view schematically illustrating a configuration of an electrical connection box according to an embodiment.
Figure 2:
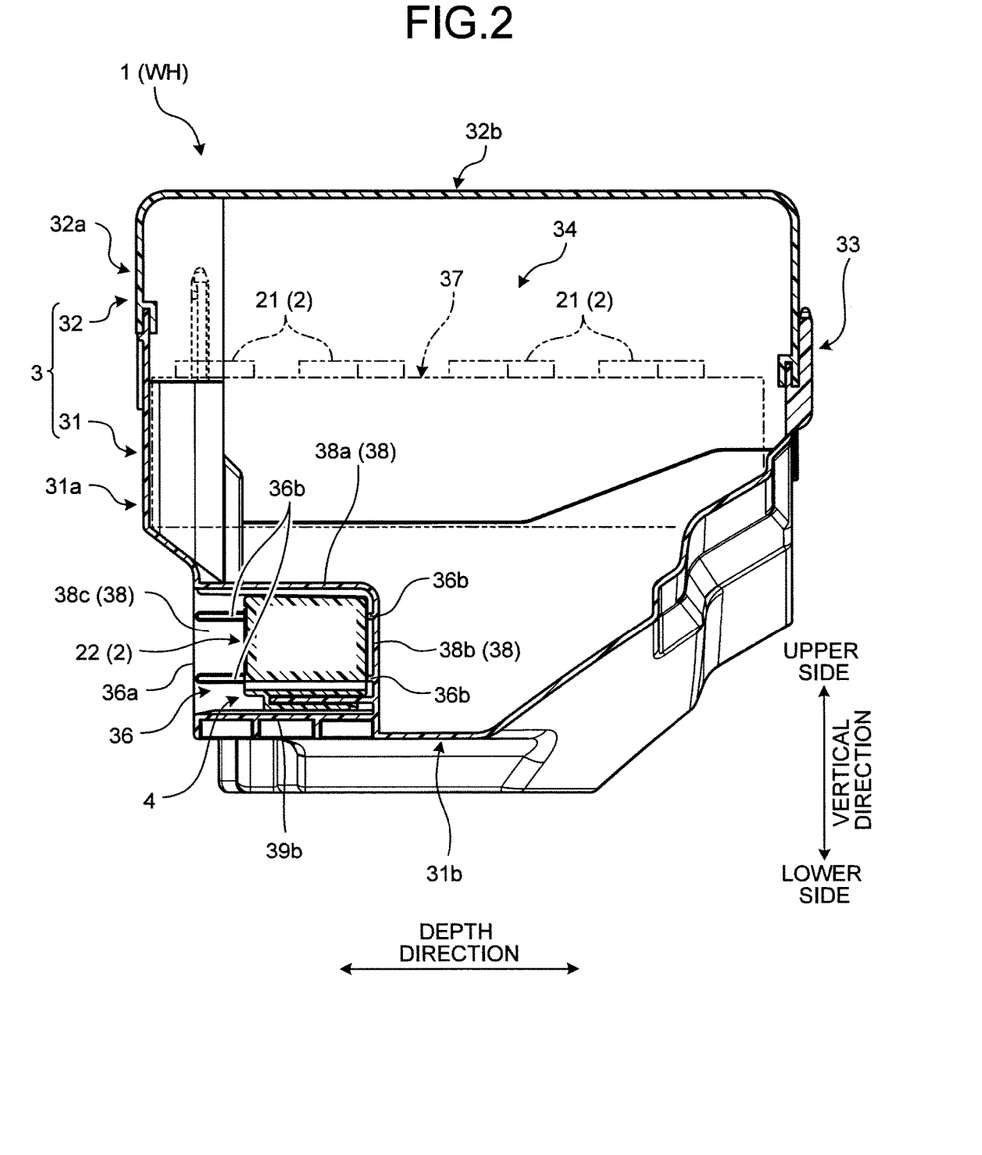
FIG. 2 is a cross-sectional view schematically illustrating the configuration of the electrical connection box according to the embodiment.
Figure 3:
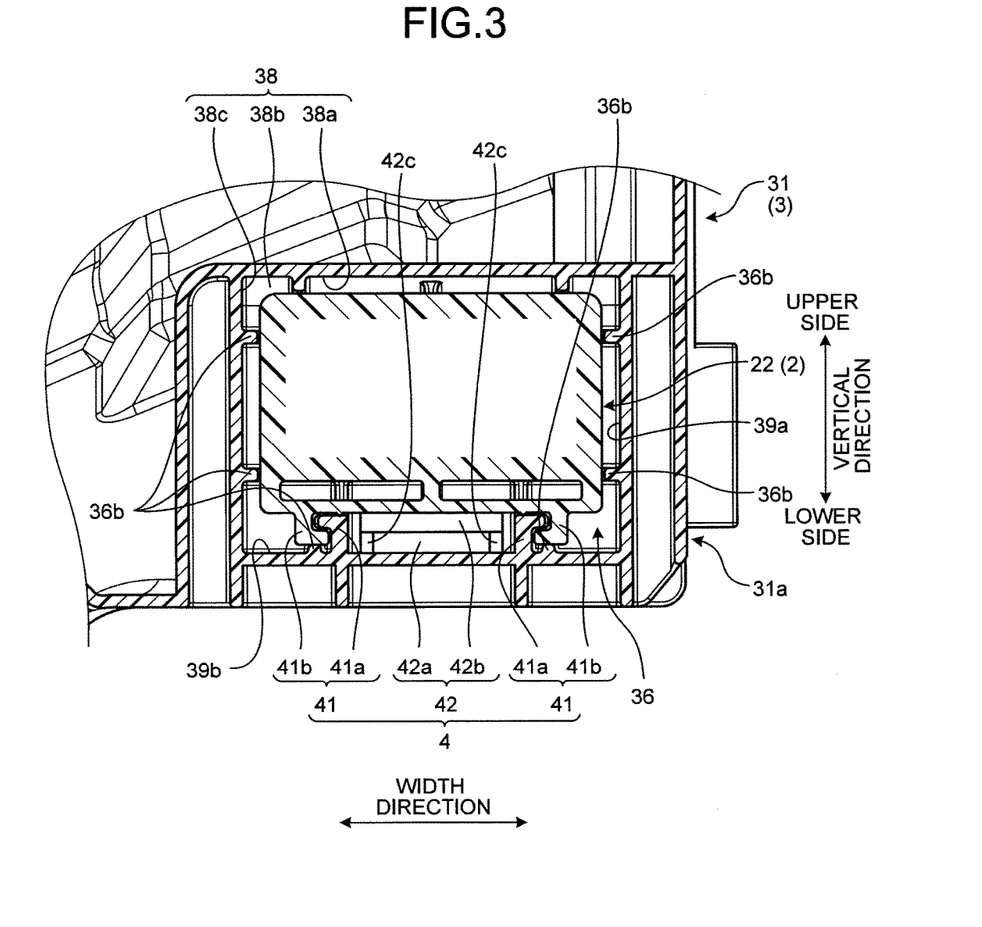
FIG. 3 is a partial cross-sectional view including a latch mechanism of the electrical connection box according to the embodiment.
Figure 4:
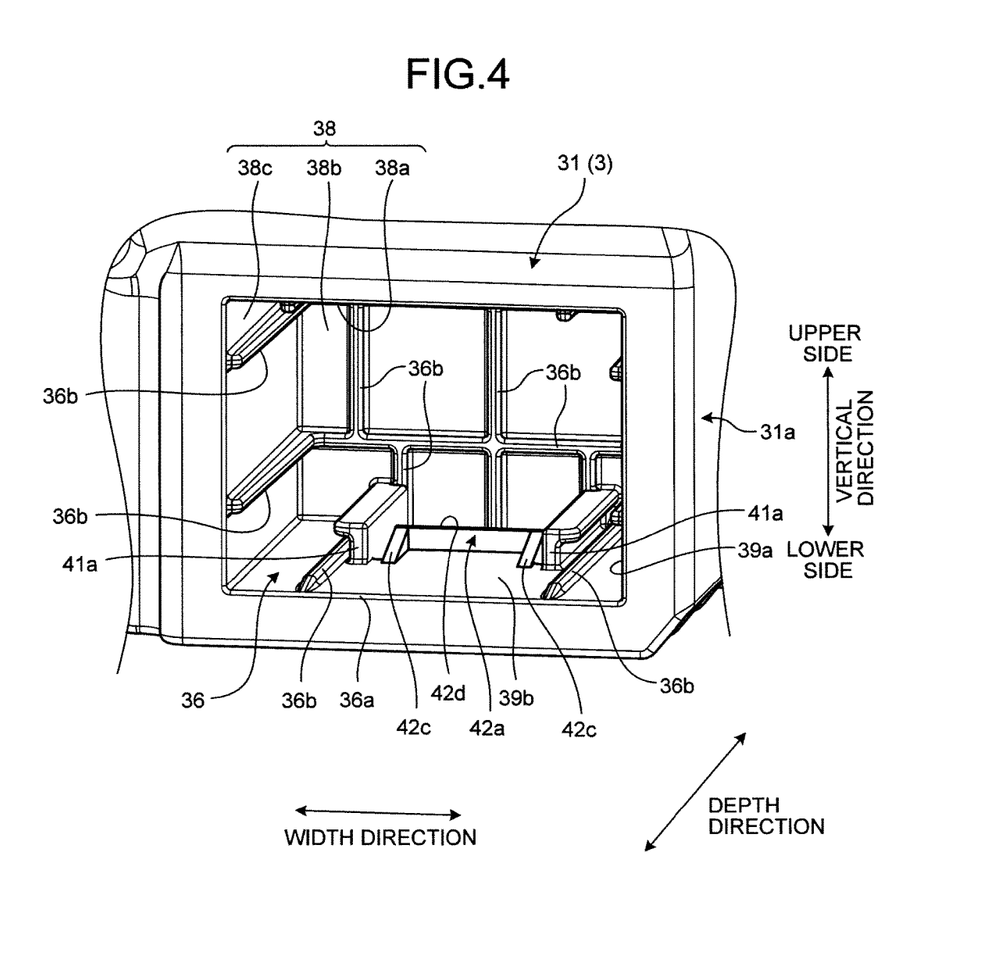
FIG. 4 is a partial perspective view including a housing recessed portion of the electrical connection box according to the embodiment.
Figure 5:
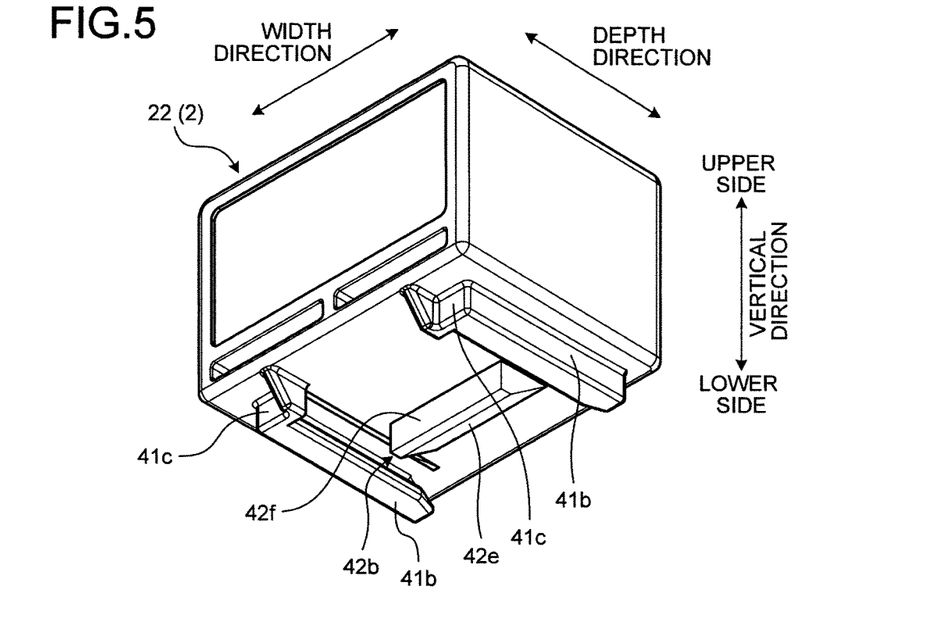
FIG. 5 is a perspective view schematically illustrating a configuration of a second electronic component of the electrical connection box according to the embodiment.
Figure 6:
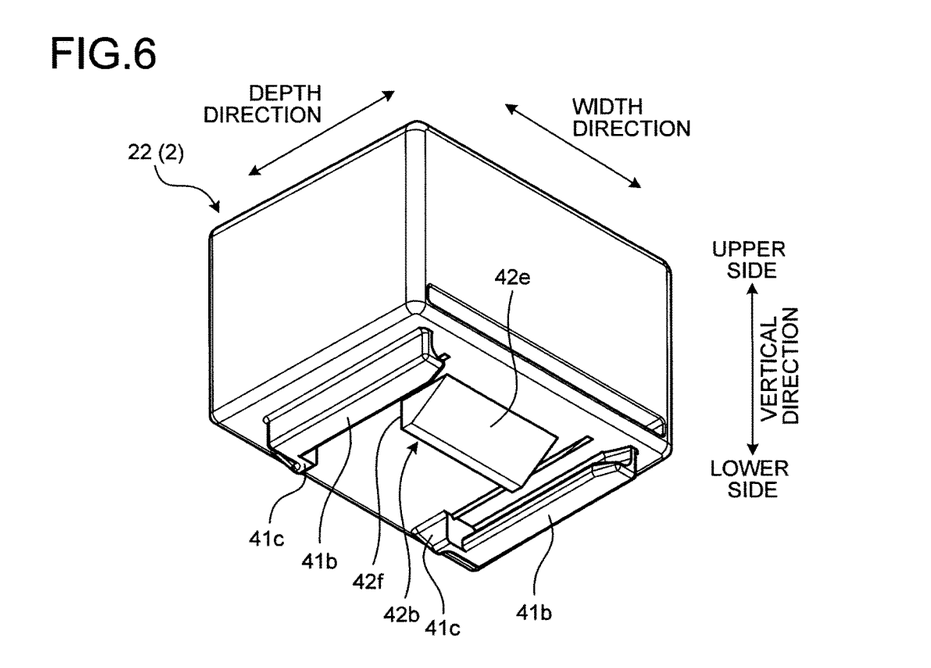
FIG. 6 is a perspective view schematically illustrating the configuration of the second electronic component of the electrical connection box according to the embodiment.
Figure 7:
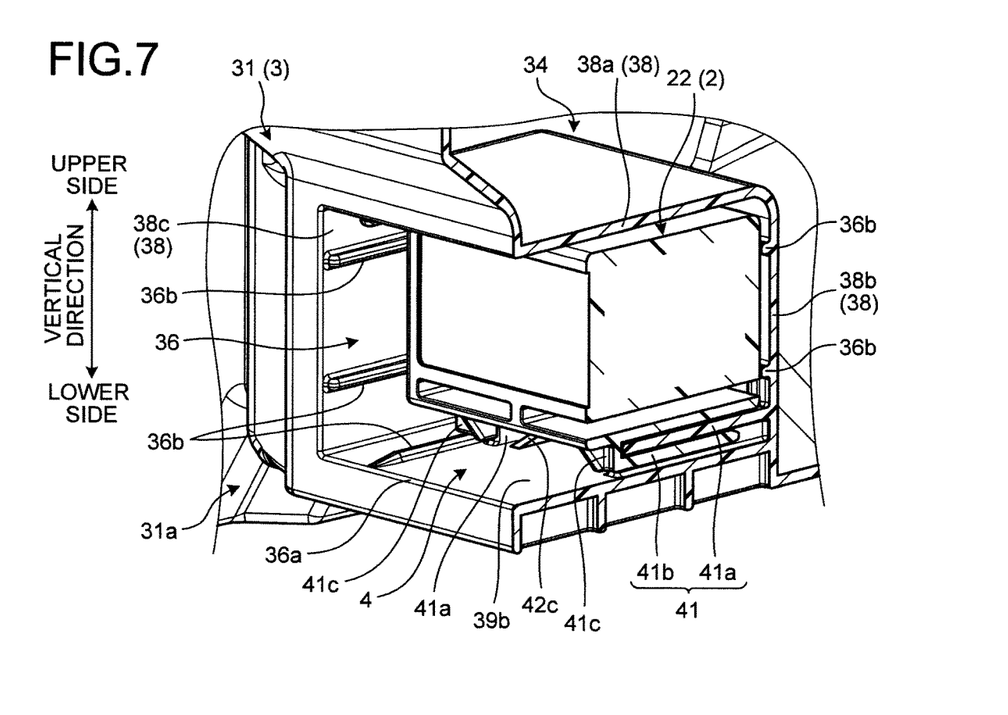
FIG. 7 is a partial cross-sectional perspective view including the latch mechanism of the electrical connection box according to the embodiment.
Figure 8:
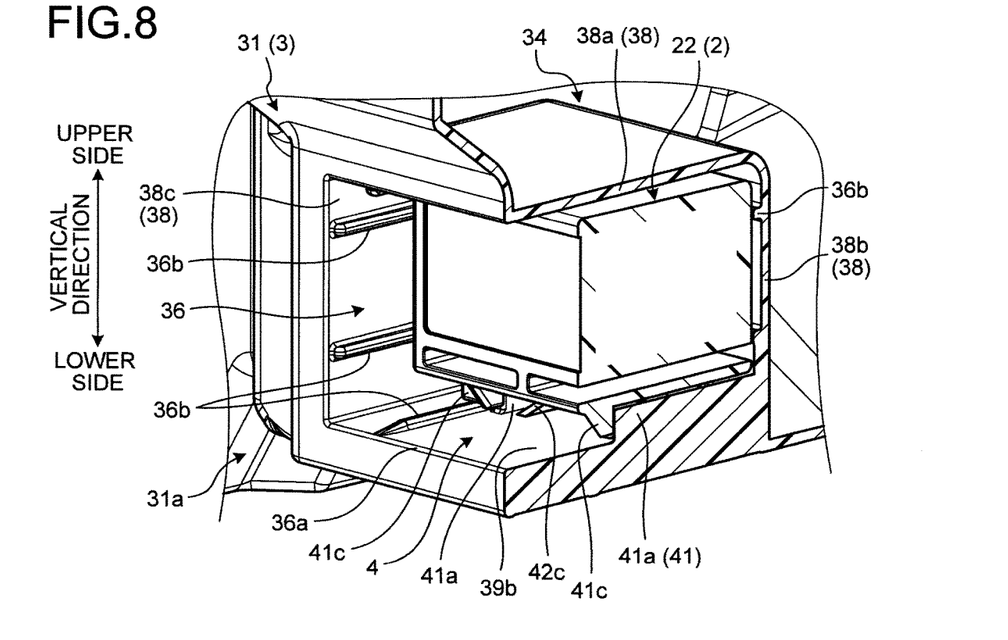
FIG. 8 is a partial cross-sectional perspective view including the latch mechanism of the electrical connection box according to the embodiment.
Figure 9:
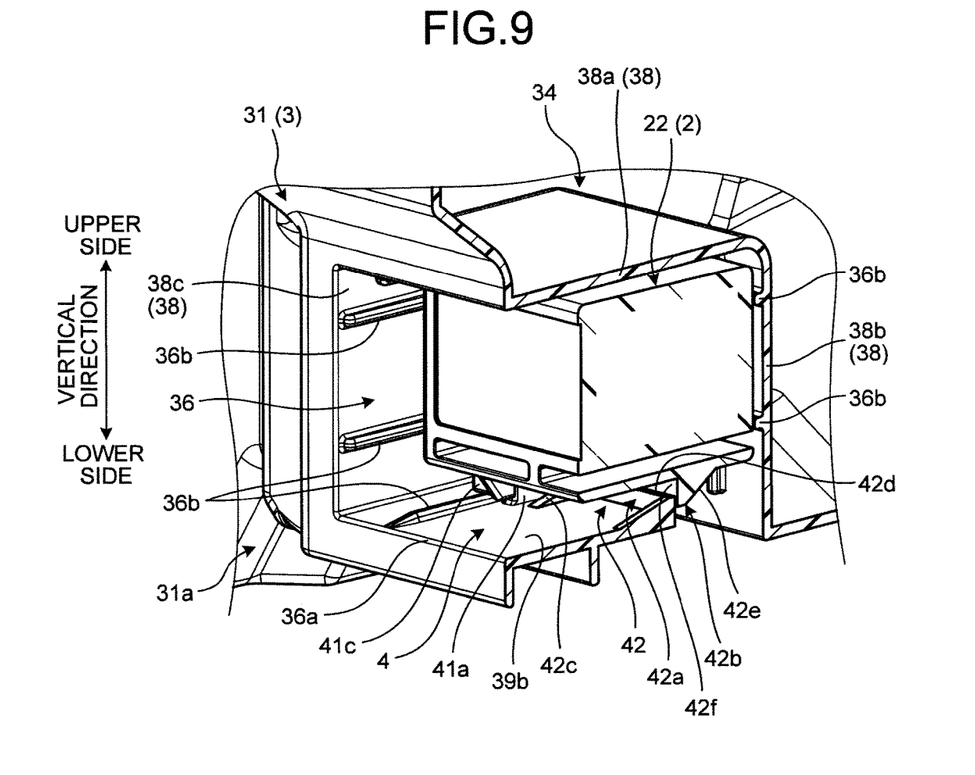
FIG. 9 is a partial cross-sectional perspective view including the latch mechanism of the electrical connection box according to the embodiment.

FIG. 1 is a perspective view schematically illustrating a configuration of an electrical connection box according to the embodiment. FIG. 2 is a cross-sectional view schematically illustrating the configuration of the electrical connection box according to the embodiment. FIG. 3 is a partial cross-sectional view including a latch mechanism of the electrical connection box according to the embodiment. FIG. 4 is a partial perspective view including a housing recessed portion of the electrical connection box according to the embodiment. FIGS. 5 and 6 are perspective views schematically illustrating a configuration of a second electronic component of the electrical connection box according to the embodiment. FIGS. 7 to 9 are partial cross-sectional perspective views including the latch mechanism of the electrical connection box according to the embodiment. In FIG. 1, an upper cover and electrical wires are illustrated by alternate long and two short dashes line to make it easy to understand. In the same manner, in FIG. 2, a block and first electronic components are illustrated by alternate long and two short dashes line to make it easy to understand. The cross-sectional shape of the second electronic component is illustrated being partially simplified.

An electrical connection box 1 illustrated in FIGS. 1 and 2 is the one that is fitted to a vehicle such as an automobile, is built in a wire harness WH, and puts together and houses therein electrical components such as a connector constituting a component for coupling an electrical wire and others, a fuse, a relay, a capacitor, a branch portion, and an electronic control unit. The electrical connection box 1 is placed in an engine room of the vehicle and a lower portion of a vehicle body, and is connected between a power source such as a battery and various electronic devices fitted to the inside of the vehicle. The electrical connection box 1 distributes electrical power supplied from the power source to the various electronic devices that are in the inside of the vehicle. The electrical connection box 1 may be referred to as a junction box, a fuse box, a relay box, and others. However, these are generically referred to as an electrical connection box according to the embodiment. Each of the directions used in the following description is explained as the direction in a state that the electrical connection box 1 is fitted to the vehicle unless otherwise specifically noted. For example, a vertical direction, a lower end portion in the vertical direction, an upper end portion in the vertical direction, an upper side in the vertical direction, and a lower side in the vertical direction in the following description mean the vertical direction, the lower end portion in the vertical direction, the upper end portion in the vertical direction, the upper side in the vertical direction, and the lower side in the vertical direction in a state that the electrical connection box 1 is fitted to the vehicle, respectively.

The wire harness WH is the one that, by bundling a plurality of electrical wires W used for power supply and signal communication for the connection among various devices fitted to the vehicle as an assembly component, makes the electrical wires W connect to the respective devices at one time via connectors and others, for example. The wire harness WH includes a plurality of electrical wires W, and the electrical connection box 1 that is electrically connected to the electrical wires W. The electrical wire W includes a conductor portion (a core wire) in which a plurality of conductive metal wires are twisted together, and an insulative sheath portion that covers the outside of the conductor portion, for example. The wire harness WH bundles and puts together a plurality of electrical wires W, and the electrical wires W that have been bundled are electrically connected at the end portions thereof to the electrical connection box 1, via the connectors and others as a connecting portion. The wire harness WH may further include, in addition to the foregoing, a grommet, a protector, a fastener, and others.

The electrical connection box 1 includes electronic components 2, a housing 3 that houses therein the electronic components 2, and a latch mechanism 4. The electrical connection box 1 houses various electronic components 2 in a housing space portion 34 and a housing recessed portion 36 that are formed in the housing 3. The electrical connection box 1 according to the embodiment includes an insertion hole 35 on the housing 3, and the electrical wires W that are electrically connected to the electronic components 2 housed in the housing 3 are inserted to extend over the inside and the outside of the housing 3 via the insertion hole 35. In the following description, each constituent of the electrical connection box 1 will be explained concretely, with reference to the various drawings.

The electronic components 2 are the ones that are housed in the inside of the housing 3 and to which the electrical wires W are electrically connected. A plurality of electronic components 2 are provided. The electronic components 2 are a connector, a fuse, a relay, a capacitor, a branch portion, an electronic control unit, an electronic component unit in which the foregoing are unitized, and others, for example. The electronic components 2 include a plurality of first electronic components 21 that are housed in the housing space portion 34, and a second electronic component 22 that is housed in the housing recessed portion 36. The first electronic components 21 are a connector, a fuse, a relay, a branch portion, an electronic control unit, an electronic component unit in which the foregoing are unitized, and others, for example. The second electronic component 22 is typically a component of mass larger than the first electronic components 21, and is a large capacitance capacitor and others formed in a substantially rectangular parallelepiped shape, for example. The first electronic components 21 are each connected to at least one of a plurality of electrical wires W, and the second electronic component 22 is connected to at least one of the other electrical wires W.

The housing 3 is the one that houses the electronic components 2 in the housing space portion 34 and the housing recessed portion 36 formed therein. The housing 3 includes a lower cover 31 as a housing member, and an upper cover 32 as a lid member, and by combining the lower cover 31 and the upper cover 32, is formed in a substantially rectangular parallelepiped box shape as a whole. The housing 3 is in a two-layer block structure that is divided into the lower cover 31 and the upper cover 32, and the lower cover 31 and the upper cover 32 are stacked along a certain stacking direction, are fitted to each other, and partition the housing space portion 34 that houses therein a plurality of first electronic components 21. The lower cover 31 and the upper cover 32 are formed of insulative synthetic resin.

The lower cover 31 is a primary member forming the housing space portion 34 and the housing recessed portion 36 that the electronic components 2 (the first electronic components 21, the second electronic component 22) are fitted to. The lower cover 31 is a dish-shaped (tray-shaped) member having an opening on the upper side in the vertical direction. The lower cover 31 is formed in a hollow shape by a sidewall portion 31a that is a wall formed in a polygonal tubular shape (a rectangular tubular shape), and by a bottom portion 31b that closes an opening on one side (the opening on the lower side in the vertical direction) of the sidewall portion 31a. In the lower cover 31, in a state that the electrical connection box 1 is connected to the engine room and the like, the opening is positioned on the upper side in the vertical direction. The upper cover 32 is a lid-like member that closes the opening of the lower cover 31 on the upper side in the vertical direction. The upper cover 32 is formed in a hollow shape by a sidewall portion 32a that is a wall formed in a polygonal tubular shape (a rectangular tubular shape), and by a ceiling portion 32b that closes an opening on one side (the opening on the upper side in the vertical direction) of the sidewall portion 32a. In the housing 3, the upper cover 32 is fitted to the lower cover 31 on the upper side in the vertical direction such that the opening of the lower cover 31 and the opening of the upper cover 32 face each other. In the housing 3, the lower cover 31 and the upper cover 32 are latched via locking mechanisms 33 of various types. The stacking direction in which the lower cover 31 and the upper cover 32 are stacked, typically, lies along the vertical direction in a state that the electrical connection box 1 is connected to the engine room and the like. However, depending on the installation situation of the electrical connection box 1, the electrical connection box 1 may be installed such that the stacking direction has a certain angle with respect to the vertical direction.

The housing 3 that is composed of the lower cover 31 and the upper cover 32 includes the housing space portion 34, the insertion hole 35, and the housing recessed portion 36.

The housing space portion 34 is partitioned by the lower cover 31 and the upper cover 32, and is a space surrounded by the lower cover 31 and the upper cover 32. That is, in the housing space portion 34, the direction intersecting the vertical direction is partitioned by the sidewall portion 31a of the lower cover 31 and the sidewall portion 32a of the upper cover 32, the lower side in the vertical direction is partitioned by the bottom portion 31b of the lower cover 31, and the upper side in the vertical direction is partitioned by the ceiling portion 32b of the upper cover 32. In the electrical connection box 1, a block 37 is provided in the inside of this housing space portion 34. The block 37 is detachably fitted to the lower cover 31. The block 37 is formed of insulative synthetic resin as the same as the lower cover 31 and others, and a number of cavities are formed thereon. Of the electronic components 2, each of the first electronic components 21 is fitted to the inside of the respective cavities of the block 37. In the block 37, with respect to each of the cavities, by inserting and fitting the first electronic components 21 from the upper side in the vertical direction, and by inserting and fitting terminal lugs and others constituting the terminals of the electrical wires W from the lower side in the vertical direction, the respective first electronic components 21 and the electrical wires W are electrically connected.

The insertion hole 35 is the one that lets the electrical wires W, which are connected to the electronic components 2 in the housing space portion 34, insert so as to extend over the inside and the outside of the housing 3, in other words, to extend over the inside and the outside of the housing space portion 34, and is formed on the mating surfaces of the upper end portion of the sidewall portion 31a of the lower cover 31 and the lower end portion of the sidewall portion 32a of the upper cover 32. The insertion hole 35 is formed in a substantially circular shape in cross-section, and is open toward the direction intersecting the stacking direction of the lower cover 31 and the upper cover 32, that is, toward the horizontal direction. The electrical wires W, which are connected to the first electronic components 21 in the housing space portion 34, are inserted to extend over the inside and the outside of the housing 3 via the insertion hole 35 and are wired.

The housing recessed portion 36 is partitioned below the housing space portion 34 in the vertical direction by a partition wall portion 38. The housing recessed portion 36 is formed in the lower cover 31 as a space portion separate from the housing space portion 34 being separated by the partition wall portion 38. The housing recessed portion 36 is formed, in the lower cover 31, as a space portion in a substantially rectangular parallelepiped shape, is closed on one side in the horizontal direction, and is provided with an opening 36a on the other side in the horizontal direction. The opening 36a of the housing recessed portion 36 is formed, in the lower cover 31, on one wall surface constituting the wall in the direction intersecting the stacking direction, that is, the sidewall portion 31a. The opening 36a is formed in a substantially quadrate shape in cross-section.

In the following description, the direction that the housing recessed portion 36 extends from the opening 36a along the horizontal direction may be referred to as "depth direction," and the closed side may be referred to as "back side." The direction that is orthogonal to the vertical direction and the depth direction may be referred to as "width direction."

Specifically, the housing recessed portion 36 is partitioned from the housing space portion 34 by, as the partition wall portion 38 to partition the housing recessed portion 36 from the housing space portion 34, a total of three wall portions of a first partition wall portion 38a, a second partition wall portion 38b, and a third partition wall portion 38c. Furthermore, the housing recessed portion 36 is partitioned by a total of two wall portions of a sidewall portion 39a and a bottom wall portion 39b from the external space of the housing 3. The first partition wall portion 38a, the second partition wall portion 38b, the third partition wall portion 38c, the sidewall portion 39a, and the bottom wall portion 39b are the ones that constitute a part of the lower cover 31.

The first partition wall portion 38a is a wall that partitions the upper surface of the housing recessed portion 36 on the upper side in the vertical direction. The first partition wall portion 38a is substantially orthogonal to the vertical direction and extends along the horizontal direction. The first partition wall portion 38a intervenes below the housing space portion 34 in the vertical direction and partitions the housing space portion 34 and the housing recessed portion 36. The second partition wall portion 38b is a wall that partitions the surface of the housing recessed portion 36 on the closed side in the horizontal direction, in other words, a blocked surface on the back side in the horizontal direction that faces the opening 36a (the surface on the back side of the housing recessed portion 36). The second partition wall portion 38b extends along the vertical direction. The second partition wall portion 38b intervenes on the lateral side of the housing space portion 34 in the horizontal direction, and partitions the housing space portion 34 and the housing recessed portion 36. The third partition wall portion 38c is a wall that partitions the surface substantially orthogonal to the first partition wall portion 38a and the second partition wall portion 38b in the housing recessed portion 36, in other words, the side surface of the housing recessed portion 36 that lies along the depth direction. The third partition wall portion 38c extends along the vertical direction. The third partition wall portion 38c intervenes on the lateral side of the housing space portion 34 in the horizontal direction, and partitions the housing space portion 34 and the housing recessed portion 36. The sidewall portion 39a is a wall that partitions the surface substantially orthogonal to the first partition wall portion 38a and the second partition wall portion 38b in the housing recessed portion 36, in other words, the side surface of the housing recessed portion 36 that lies along the depth direction and faces the third partition wall portion 38c in the horizontal direction (the direction orthogonal to the depth direction). The sidewall portion 39a extends along the vertical direction. The sidewall portion 39a intervenes on the lateral side of the housing recessed portion 36 in the horizontal direction, and partitions the housing recessed portion 36 and the external space of the housing 3. The sidewall portion 39a constitutes a part of the sidewall portion 31a of the lower cover 31. The bottom wall portion 39b is a wall that partitions the lower surface of the housing recessed portion 36 on the lower side in the vertical direction, more specifically, the lower surface that faces in the vertical direction to the first partition wall portion 38a. The bottom wall portion 39b is substantially orthogonal to the vertical direction and extends along the horizontal direction. The bottom wall portion 39b intervenes below the housing recessed portion 36 in the vertical direction and partitions the housing recessed portion 36 and the external space of the housing 3. The bottom wall portion 39b constitutes a part of the bottom portion 31b of the lower cover 31. On the first partition wall portion 38a, the second partition wall portion 38b, the third partition wall portion 38c, the sidewall portion 39a, and the bottom wall portion 39b, reinforcing ribs 36b are provided on the front surfaces and the back surfaces thereof.

The housing recessed portion 36 is formed as a space portion in a substantially rectangular parallelepiped shape in a size capable of housing the second electronic component 22 by these five wall portions, that is, the first partition wall portion 38a constituting the upper surface, the second partition wall portion 38b constituting the blocked surface, the third partition wall portion 38c constituting one of the side surfaces, the sidewall portion 39a constituting the other of the side surfaces, and the bottom wall portion 39b constituting the lower surface. The housing recessed portion 36 surrounds the surfaces of the second electronic component 22 formed in a substantially rectangular parallelepiped shape other than the surface on the opening 36a side, by these wall portions forming the housing recessed portion 36, that is, the wall surfaces of the first partition wall portion 38a, the second partition wall portion 38b, the third partition wall portion 38c, the sidewall portion 39a, and the bottom wall portion 39b.

The latch mechanism 4 is the one that is positioned in the housing recessed portion 36 and latches the second electronic component 22 and the housing 3 together, in a state that the second electronic component 22 is housed in the housing recessed portion 36. The latch mechanism 4 according to the embodiment includes, as illustrated in FIGS. 3 to 6, guide portions 41 and a latch portion 42. The latch mechanism 4 according to the embodiment includes two guide portions 41.

Each of the guide portions 41 includes a housing-side rail portion 41a as a housing-side guide portion, and a component-side rail portion 41b as an electronic-component side guide portion.

The housing-side rail portion 41a is formed within the housing recessed portion 36 of the lower cover 31 constituting the housing 3. The housing-side rail portion 41a according to the embodiment is formed, along the depth direction, on the surface of the bottom wall portion 39b on the upper side in the vertical direction constituting the lower surface of the housing recessed portion 36 on the lower side in the vertical direction. The housing-side rail portion 41a is formed within the housing recessed portion 36 from the opening 36a side to the back side along the horizontal direction. The housing-side rail portion 41a extends in a line shape from a middle portion of the depth direction to the second partition wall portion 38b on the surface of the bottom wall portion 39b on the upper side in the vertical direction. The housing-side rail portion 41a projects toward the upper side in the vertical direction from the surface of the bottom wall portion 39b on the upper side in the vertical direction, and the tip portion thereof is bent substantially perpendicularly along the width direction. That is, in the housing-side rail portion 41a, the cross-sectional shape along the width direction is formed in a substantially L shape. The housing-side rail portion 41a of one of the guide portions 41 out of the two guide portions 41 and the housing-side rail portion 41a of the other of the guide portions 41 are formed leaving space in the width direction and substantially in parallel along the depth direction, and the tip portions thereof are bent in directions opposite to each other. Each of the housing-side rail portions 41a is bent in the direction that both tip portions are spaced apart from each other toward the outside of the housing recessed portion 36 along the width direction.

The component-side rail portion 41b is formed on the surface of the second electronic component 22 that is housed in the housing recessed portion 36. The component-side rail portion 41b according to the embodiment is formed, along the depth direction, on the lower surface of the second electronic component 22 on the lower side in the vertical direction. That is, the component-side rail portion 41b is formed, along the horizontal direction, on the lower surface of the second electronic component 22 that faces in the vertical direction to the surface of the bottom wall portion 39b on the upper side in the vertical direction, in a state that the second electronic component 22 is housed in the housing recessed portion 36. The component-side rail portion 41b extends in a line shape, on the lower surface of the second electronic component 22, from near the end portion on one side in the depth direction to near the end portion on the other side in the depth direction. The component-side rail portion 41b projects toward the lower side in the vertical direction from the lower surface of the second electronic component 22 on the lower side in the vertical direction, and the tip portion thereof is bent substantially perpendicularly along the width direction. That is, in the component-side rail portion 41b, the cross-sectional shape along the width direction is formed in a substantially L shape. The component-side rail portion 41b of one of the guide portions 41 out of the two guide portions 41 and the component-side rail portion 41b of the other of the guide portions 41 are formed leaving space in the width direction and substantially in parallel along the depth direction, and the tip portions thereof are bent in directions opposite to each other. Each of the component-side rail portions 41b is bent in the direction that both tip portions come closer to each other toward the inner side of the housing recessed portion 36 along the width direction. Each of the component-side rail portions 41b is formed at the position in which the component-side rail portion 41b is positioned on the outside of the respective housing-side rail portion 41a in the width direction and the bent tip portion thereof meshes each other with the tip portion of the respective housing-side rail portions 41a, in a state that the second electronic component 22 is housed in the housing recessed portion 36.

That is, the latch mechanism 4 clamps the two housing-side rail portions 41a by the two component-side rail portions 41b with respect to the width direction, and the bent tip portions of the housing-side rail portions 41a and the component-side rail portions 41b, which face each other in the width direction, mesh and engage with each other (see FIGS. 3, 7, and others). The respective guide portions 41 can, by each of the component-side rail portions 41b being guided by the respective housing-side rail portions 41a along the depth direction (the horizontal direction), guide the second electronic component 22 along the depth direction and position it in the width direction, in a state that the respective housing-side rail portions 41a and the respective component-side rail portions 41b are engaged with each other when inserting the second electronic component 22 into the housing recessed portion 36.

In each of the component-side rail portions 41b, a restriction portion 41c is formed at the end portion positioned on the opening 36a side in a state that the second electronic component 22 is housed in the housing recessed portion 36. Each restriction portion 41c comes into contact with the end portion of the respective housing-side rail portions 41a on the opening 36a side in the depth direction, in a state that the second electronic component 22 is inserted up to a certain position in the housing recessed portion 36, and thus restricts the second electronic component 22 from moving toward the back side in the depth direction, and positions it (see FIG. 8).

The latch portion 42 includes a housing-side latch portion 42a, and a component-side latch portion 42b as an electronic-component side latch portion.

The housing-side latch portion 42a is formed within the housing recessed portion 36 of the lower cover 31 constituting the housing 3. The housing-side latch portion 42a according to the embodiment is formed, along the width direction, on the surface on which the above-described housing-side rail portions 41a are formed, that is, on the surface of the bottom wall portion 39b on the upper side in the vertical direction constituting the lower surface of the housing recessed portion 36 on the lower side in the vertical direction. The housing-side latch portion 42a is formed in a plate-like shape projecting toward the upper side in the vertical direction from the surface of the bottom wall portion 39b on the upper side in the vertical direction, and is formed to extend along the width direction from the housing-side rail portion 41a on one side to the housing-side rail portion 41a on the other side. In the housing-side latch portion 42a, further formed are housing-side inclined portions 42c at both ends on the surface on the opening 36a side in the depth direction. The housing-side inclined portions 42c are inclined surfaces that push up the component-side latch portion 42b, which will be described later, toward the upper side in the vertical direction so as to let it climb over the housing-side latch portion 42a when inserting the second electronic component 22 into the housing recessed portion 36. The housing-side inclined portions 42c are formed as the inclined surfaces for which the ends on the opening 36a side in the depth direction are positioned on the surface of the bottom wall portion 39b on the upper side in the vertical direction, the inclined portions head gradually toward the upper side in the vertical direction toward the back side in the depth direction, and the ends on the back side in the depth direction are positioned at the upper end portion of the plate-like portion of the housing-side latch portion 42a. The housing-side latch portion 42a is formed as a housing-side contact surface 42d for which the surface on the back side in the depth direction comes into contact with the component-side latch portion 42b.

The component-side latch portion 42b is formed on the surface of the second electronic component 22 that is housed in the housing recessed portion 36. The component-side latch portion 42b according to the embodiment is formed, along the width direction, on the surface on which the above-described component-side rail portions 41b are formed, that is, on the lower surface of the second electronic component 22 on the lower side in the vertical direction. That is, the component-side latch portion 42b is formed, along the horizontal direction, on the lower surface of the second electronic component 22 that faces in the vertical direction to the surface of the bottom wall portion 39b on the upper side in the vertical direction, in a state that the second electronic component 22 is housed in the housing recessed portion 36. The component-side latch portion 42b is formed in a trapezoidal beam shape projecting toward the lower side in the vertical direction from the lower surface of the second electronic component 22 on the lower side in the vertical direction, and is formed to extend along the width direction from near the component-side rail portion 41b on one side to near the component-side rail portion 41b on the other side. In the second electronic component 22, however, between each of the component-side rail portions 41b and the end portion of the respective component-side latch portions 42b, gaps are ensured to a degree that the above-described housing-side rail portions 41a can be inserted. In the component-side latch portion 42b, a component-side inclined portion 42e is further formed on the surface on the back side in the depth direction. The component-side inclined portion 42e is an inclined surface that is pushed up toward the upper side in the vertical direction by the housing-side inclined portions 42c when inserting the second electronic component 22 into the housing recessed portion 36. The component-side inclined portion 42e is formed as the inclined surface for which the end on the back side in the depth direction is positioned on the lower surface of the second electronic component 22 on the lower side in the vertical direction, the inclined portion heads gradually toward the lower side in the vertical direction toward the opening 36a side in the depth direction, and the end on the opening 36a side in the depth direction is positioned at the lower end of the beam shape portion of the component-side latch portion 42b. The component-side latch portion 42b is formed as a component-side contact surface 42f for which the surface on the opening 36a side in the depth direction comes into contact with the housing-side contact surface 42d.

In the latch portion 42, when inserting the second electronic component 22 into the housing recessed portion 36, the component-side inclined portion 42e of the second electronic component 22 comes into contact with the housing-side inclined portions 42c, and the second electronic component 22 as a whole is pushed up toward the upper side in the vertical direction while being guided, and thus the component-side latch portion 42b climbs over the housing-side latch portion 42a. Then, in the latch portion 42, the component-side latch portion 42b climbs over the housing-side latch portion 42a and is positioned on the back side of the housing-side latch portion 42a in the depth direction, and thus the component-side contact surface 42f and the housing-side contact surface 42d come into contact with each other and the component-side latch portion 42b is latched by the housing-side latch portion 42a (see FIG. 9). Consequently, the latch portion 42 can latch the second electronic component 22 at a certain position in the housing recessed portion 36.

In the electrical connection box 1 configured as in the foregoing, when inserting the second electronic component 22 into the housing recessed portion 36, in a state that each of the housing-side rail portions 41a and each of the component-side rail portions 41b, which constitute the guide portion 41, are being engaged with each other, each of the component-side rail portions 41b is guided by the respective housing-side rail portions 41a along the depth direction. Consequently, the electrical connection box 1 can, when inserting the second electronic component 22 into the housing recessed portion 36, guide the second electronic component 22 along the depth direction and can position the second electronic component 22 in the width direction. At this time, in the electrical connection box 1, the component-side inclined portion 42e constituting the latch portion 42 is pushed up toward the upper side in the vertical direction by the housing-side inclined portions 42c with the whole second electronic component 22, and thus the component-side latch portion 42b climbs over the housing-side latch portion 42a. Then, in the electrical connection box 1, the component-side contact surface 42f of the component-side latch portion 42b and the housing-side contact surface 42d of the housing-side latch portion 42a, which constitute the latch portion 42, come into contact with each other, and thus the component-side latch portion 42b is latched by the housing-side latch portion 42a. Consequently, the second electronic component 22 can be latched in the housing recessed portion 36. In the electrical connection box 1, in a state that the component-side latch portion 42b is latched by the housing-side latch portion 42a, each of the restriction portions 41c and the end portion of the respective housing-side rail portions 41a on the opening 36a side in the depth direction come into contact with each other, and the end faces of a part of the reinforcing ribs 36b come into contact with the surfaces of the second electronic component 22, thereby enabling the second electronic component 22 to be reliably positioned at a certain position in the housing recessed portion 36.

The electrical connection box 1 that has been explained in the foregoing includes: the housing 3 that includes the housing space portion 34 that is formed therein and houses therein the first electronic components 21, and the housing recessed portion 36 that is partitioned below the housing space portion 34 in the vertical direction by the partition wall portion 38, closed on one side in the horizontal direction, provided with the opening 36a on the other side in the horizontal direction, and houses therein the second electronic component 22; and the latch mechanism 4 that is positioned in the housing recessed portion 36 and latches the second electronic component 22 and the housing 3 in a state that the second electronic component 22 is housed in the housing recessed portion 36. The wire harness WH that has been explained in the foregoing includes a plurality of electrical wires W and the above-described electrical connection box 1.

Consequently, the electrical connection box 1 and the wire harness WH house the first electronic components 21 in the housing space portion 34 that is formed in the inside of the housing 3, and house the second electronic component 22 in the housing recessed portion 36 that is partitioned below the housing space portion 34 in the vertical direction by the partition wall portion 38. The housing recessed portion 36 that houses therein the second electronic component 22 is closed on one side in the horizontal direction, is provided with the opening 36a on the other side in the horizontal direction, and is inserted with the second electronic component 22 along the horizontal direction via the opening 36a opened in the horizontal direction. The latch mechanism 4 latches the housing 3 and the second electronic component 22, which is inserted into the housing recessed portion 36, in the housing recessed portion 36. Consequently, because the electrical connection box 1 and the wire harness WH are configured to house the second electronic component 22 along the horizontal direction with respect to the housing recessed portion 36 and to reliably hold it with respect to the vertical direction, the vibration resistant performance can be improved. For example, even when the vertical vibration is exerted on the second electronic component 22 along with the vehicle vibration, the second electronic component 22 can be held reliably in the housing recessed portion 36. In the electrical connection box 1 and the wire harness WH, because the second electronic component 22 can be fitted to the housing 3 by inserting it along the horizontal direction with respect to the housing recessed portion 36 and latching by the latch mechanism 4 in the inside of the housing recessed portion 36, the workability in assembling can also be improved. As a result, in the electrical connection box 1 and the wire harness WH, the second electronic component 22 can be fitted to the housing 3 properly.

In the electrical connection box 1 and the wire harness WH, because the second electronic component 22 that is a heavy item of relatively large mass as compared with the first electronic components 21 is housed in the housing recessed portion 36 partitioned below the housing space portion 34 in the vertical direction, the center of gravity can be placed on the lower side of the housing 3. As a result, in the electrical connection box 1 and the wire harness WH, the second electronic component 22 can be fitted to the housing 3 properly, on top of further improving the vibration resistant performance.

Moreover, in the electrical connection box 1 and the wire harness WH explained in the foregoing, the housing recessed portion 36 surrounds the surfaces of the second electronic component 22 other than the surface on the opening 36a side, by the wall surfaces that form the housing recessed portion 36, that is, the first partition wall portion 38a, the second partition wall portion 38b, the third partition wall portion 38c, the sidewall portion 39a, and the bottom wall portion 39b. Consequently, the electrical connection box 1 and the wire harness WH can reliably protect the second electronic component 22 by the wall surfaces of the first partition wall portion 38a, the second partition wall portion 38b, the third partition wall portion 38c, the sidewall portion 39a, and the bottom wall portion 39b, and can reliably protect the second electronic component 22 against external shock, for example.

In the electrical connection box 1 and the wire harness WH explained in the foregoing, the latch mechanism 4 includes: the guide portions 41 including the housing-side rail portions 41a formed along the horizontal direction from the opening 36a side to the back side in the housing recessed portion 36, and the component-side rail portions 41b that are formed on the second electronic component 22, engage with the housing-side rail portions 41a, and are guided along the horizontal direction; and the latch portion 42 including the housing-side latch portion 42a that is formed in the housing recessed portion 36, and the component-side latch portion 42b that is formed on the second electronic component 22 and latched by the housing-side latch portion 42a. Consequently, the electrical connection box 1 and the wire harness WH can, when inserting the second electronic component 22 into the housing recessed portion 36, latch the second electronic component 22 in the housing recessed portion 36 by the housing-side latch portion 42*a* and the component-side latch portion 42*b* of the latch portion 42, on top of improving the workability in assembling by guiding and positioning the second electronic component 22 along the depth direction by the housing-side rail portions 41*a* and the component-side rail portions 41*b* of the guide portions 41.

The electrical connection box and the wire harness in the above-described embodiment of the present invention are not limited to those in the embodiment, and various modifications can be made within the scope of the claims described in claims.

The housing 3 explained in the foregoing has been exemplified as the one that is in a two-layer block structure that is divided into the lower cover 31 and the upper cover 32. However, it is not limited to this, and it may be in a three-layer block structure or a block structure of four or more layers.

In the foregoing explanation, it has been exemplified that the housing-side rail portions 41*a* and the housing-side latch portion 42*a* are formed on the surface of the bottom wall portion 39*b*, which constitutes the lower surface of the housing recessed portion 36 on the lower side in the vertical direction, on the upper side in the vertical direction, and that the component-side rail portions 41*b* and the component-side latch portion 42*b* are formed on the lower surface of the second electronic component 22 on the lower side in the vertical direction. However, it is not limited to this. The housing-side rail portions 41*a* and the component-side rail portions 41*b* only need to be formed at positions in which it is possible to engage with each other within the housing recessed portion 36. In the same manner, the housing-side latch portion 42*a* and the component-side latch portion 42*b* only need to be formed at positions in which it is possible to latch each other within the housing recessed portion 36.

The latch mechanism 4 in the foregoing has been exemplified as the one that includes the guide portions 41 including the housing-side rail portions 41*a* and the component-side rail portions 41*b* and that includes the latch portion 42 including the housing-side latch portion 42*a* and the component-side latch portion 42*b*. However, it is not limited to this, and it may be in other configurations as long as it is the one that is positioned within the housing recessed portion 36 and that latches the second electronic component 22 and the housing 3.

The second electronic component 22 in the foregoing has been exemplified typically as a component having a mass larger than that of the first electronic components 21, for example, as a large capacitance capacitor and others that is formed in a substantially rectangular parallelepiped shape. However, it is not limited to this. The second electronic component 22 may not be in a substantially rectangular parallelepiped shape. In this case, the housing recessed portion 36 only needs to be further modified appropriately depending on the shape of the second electronic component 22.

The electrical connection box and the wire harness according to the present invention house the first electronic components in the housing space portion that is formed within the housing, and house the second electronic component in the housing recessed portion that is partitioned below the housing space portion in the vertical direction by the partition wall portion. The housing recessed portion that houses therein the second electronic component is closed on one side in the horizontal direction, is provided with the opening on the other side in the horizontal direction, and is inserted with the second electronic component along the horizontal direction via the opening opened in the horizontal direction, and the latch mechanism latches the housing and the second electronic component, which is inserted into the housing recessed portion, within the housing recessed portion. As a result, the electrical connection box and the wire harness have an advantageous effect in that the electronic components can be fitted to the housing properly.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
 a housing that includes a lower cover as a housing member and an upper cover as a lid member, and is formed in a box shape as a whole by combining the lower cover and the upper cover;
 the lower cover that includes a housing space portion that is formed therein and houses therein a first electronic component, and a housing recessed portion that is partitioned below the housing space portion in a vertical direction by a partition wall portion, closed on one side in a horizontal direction, provided with an opening on the other side in the horizontal direction, and houses therein a second electronic component; and
 a latch mechanism that is positioned in the housing recessed portion and latches the second electronic component and the housing in a state that the second electronic component is housed in the housing recessed portion.

2. The electrical connection box according to claim 1, wherein
 the housing recessed portion surrounds surfaces of the second electronic component other than a surface on a side of the opening by wall surfaces forming the housing recessed portion.

3. The electrical connection box according to claim 2, wherein
 the latch mechanism includes
 a guide portion including a housing-side guide portion that is formed along the horizontal direction from the side of the opening to a back side in the housing recessed portion, and an electronic-component side guide portion that is formed on the second electronic component, engages with the housing-side guide portion, and is guided along the horizontal direction, and
 a latch portion including a housing-side latch portion that is formed in the housing recessed portion, and an electronic-component side latch portion that is formed on the second electronic component and latched by the housing-side latch portion.

4. The electrical connection box according to claim 1, wherein
 the latch mechanism includes
 a guide portion including a housing-side guide portion that is formed along the horizontal direction from the side of the opening to a back side in the housing recessed portion, and an electronic-component side guide portion that is formed on the second electronic component, engages with the housing-side guide portion, and is guided along the horizontal direction, and
 a latch portion including a housing-side latch portion that is formed in the housing recessed portion, and an electronic-component side latch portion that is formed on the second electronic component and latched by the housing-side latch portion.

5. A wire harness comprising:

a plurality of electrical wires;

a housing that includes a lower cover as a housing member and an upper cover as a lid member, and is formed in a box shape as a whole by combining the lower cover and the upper cover; and an electrical connection box that includes the lower cover that includes a housing space portion that is formed therein and houses therein a first electronic component to which one of the electrical wires is connected, and a housing recessed portion that is partitioned below the housing space portion in a vertical direction by a partition wall portion, closed on one side in a horizontal direction, provided with an opening on the other side in the horizontal direction, and houses therein a second electronic component to which one of the other electrical wires is connected, and a latch mechanism that is positioned in the housing recessed portion and latches the second electronic component and the housing in a state that the second electronic component is housed in the housing recessed portion.

\* \* \* \* \*